(12) United States Patent
Fowler et al.

(10) Patent No.: US 9,182,882 B2
(45) Date of Patent: Nov. 10, 2015

(54) DYNAMIC CREATION AND MODELING OF SOLID MODELS

(75) Inventors: Gregory W. Fowler, Toronto (CA); Vincent Ma, Richmond Hill (CA); Hans-Frederick Brown, San Rafael, CA (US)

(73) Assignee: Autodesk, Inc., San Rafael, CA (US)

( * ) Notice: Subject to any disclaimer, the term of this patent is extended or adjusted under 35 U.S.C. 154(b) by 485 days.

(21) Appl. No.: 13/351,128

(22) Filed: Jan. 16, 2012

(65) Prior Publication Data

US 2013/0181986 A1 Jul. 18, 2013

(51) Int. Cl.
*G06T 15/00* (2011.01)
*G06F 3/0481* (2013.01)
*G06T 17/30* (2006.01)
*G06F 3/0488* (2013.01)
*G06F 17/50* (2006.01)
*G06F 3/0484* (2013.01)

(52) U.S. Cl.
CPC .......... *G06F 3/04815* (2013.01); *G06F 3/0488* (2013.01); *G06F 3/04842* (2013.01); *G06F 17/50* (2013.01); *G06T 17/30* (2013.01)

(58) Field of Classification Search
CPC ... G06F 3/048; G06F 3/0488; G06F 3/04842; G06F 17/50; G06F 3/04815; G06T 17/30
USPC ......... 345/419, 173, 420, 441, 442, 443, 175, 345/473
See application file for complete search history.

(56) References Cited

U.S. PATENT DOCUMENTS

| | | | |
|---|---|---|---|
| 5,490,241 A | 2/1996 | Mallgren et al. | |
| 6,057,845 A | 5/2000 | Dupouy | |
| 7,465,230 B2 * | 12/2008 | LeMay et al. | 463/32 |
| 7,489,306 B2 * | 2/2009 | Kolmykov-Zotov et al. | 345/173 |
| 7,696,998 B2 | 4/2010 | Bae | |
| 7,889,195 B2 * | 2/2011 | Shih et al. | 345/419 |
| 8,514,221 B2 * | 8/2013 | King et al. | 345/419 |
| 8,914,259 B2 * | 12/2014 | Kripac et al. | 703/1 |
| 2004/0001060 A1 | 1/2004 | Stollnitz et al. | |
| 2005/0162402 A1 | 7/2005 | Watanachote | |
| 2005/0233799 A1 | 10/2005 | LeMay et al. | |
| 2006/0001650 A1 | 1/2006 | Robbins et al. | |
| 2006/0132460 A1 | 6/2006 | Kolmykov-Zotov et al. | |
| 2008/0036773 A1 | 2/2008 | Bae | |
| 2008/0165140 A1 | 7/2008 | Christie et al. | |

(Continued)

FOREIGN PATENT DOCUMENTS

WO 2010/056427 5/2010

OTHER PUBLICATIONS

International Search Report for PCT Application No. PCT/US2012/046540 filed on Jul. 12, 2012.

(Continued)

*Primary Examiner* — Phu K Nguyen
(74) *Attorney, Agent, or Firm* — Gates & Cooper LLP

(57) ABSTRACT

A method, apparatus, system, and computer-readable storage device is configured to perform three-dimensional (3D) modeling. A modeling tool is activated in a 3D modeling application executing on a multi-touch device. An input touch event and input gesture for creating a new 3D geometric form is received. Dynamically, in real-time as the input gesture is received, the new 3D geometric form is created and displayed. The shape of the new 3D geometric form corresponds to the input gesture.

20 Claims, 18 Drawing Sheets

(56) References Cited

U.S. PATENT DOCUMENTS

| | | |
|---|---|---|
| 2008/0180410 A1 | 7/2008 | McCall et al. |
| 2009/0021475 A1 | 1/2009 | Steinle et al. |
| 2009/0199130 A1 | 8/2009 | Tsern et al. |
| 2010/0001962 A1 | 1/2010 | Doray et al. |
| 2010/0083111 A1 | 4/2010 | de los Reyes |
| 2010/0149211 A1 | 6/2010 | Tossing et al. |
| 2010/0295796 A1 | 11/2010 | Roberts et al. |
| 2011/0102464 A1 | 5/2011 | Godavari |
| 2011/0164029 A1 | 7/2011 | King et al. |
| 2011/0175821 A1 | 7/2011 | King |
| 2011/0209098 A1 | 8/2011 | Hinckley et al. |
| 2011/0296353 A1 | 12/2011 | Ahmed et al. |
| 2012/0210261 A1 | 8/2012 | Sarnoff et al. |
| 2013/0127910 A1 | 5/2013 | Tijssen et al. |

OTHER PUBLICATIONS

Blanke et al., "TOM A Multi-touch System for Learning Math", http://www.fh-trier.de/fileadmin/groups/12/Personen/Professoren/Schneider/papers/TOMCameraReady.pdf, May 2011.

Jakulin et al., "Artificial Aesthetic Sense", http://www.stat.columbia.edu/~jakulin/ASSAI/ Jun. 25, 2010.

Kammer et al., "Towards a Formalization of Multi-touch Gestures", http://www.dfki.de/its2010/papers/pdf/fp198.pdf, Nov. 2010.

Schoning et al., "Using Mobile Phones to Spontaneously Authenticate and Interact with Multi-Touch Surfaces", http://www.mmi.ifi.lmu.de/pubdb/publications/pub/schoening2008PhoneFlash/schoening2008PhoneFlash.pdf, 2008.

Nasri et al., "Taxonomy of interpolation constraints on recursive subdivision curves", The Visual Computer, 2002.

"CV Curve", http://www/kxcad.net/autodesk/3ds_max/Autodesk_3ds_Max_9_Reference_CV_Curve.html, Jul. 3, 2011.

International Search Report for PCT Application No. PCT/US2012/021442 filed on Jan. 16, 2012.

International Search Report for PCT Application No. PCT/US2012/021446 filed on Jan. 16, 2012.

International Search Report for PCT Application No. PCT/US2012/021448 filed on Jan. 16, 2012.

Amazon Simple Queue Service, downloaded from Wikipedia, the free encyclopedia on Aug. 11, 2010. URL: http://en.wikipedia.org/wiki/Amazon_Simple_Queue_Service.

Abbas, A.M., "A Subdivision Surface Interpolating Arbitrarily-Intersecting Network of Curves under Minimal Constraints", Computer Graphics International, Jun. 8-11, 2010, Singapore, SP11.

Biermann, H., "Sharp Features on Multiresolution Subdivision Surfaces", Proceedings Ninth Pacific Conference on Computer Graphics and Applications, Pacific Graphics, Oct. 16-18, 2001, pp. 140-149.

Levin, A., "Interpolating Nets of Curves by Smooth Subdivision Surfaces", Proceedings of SIGGRAPH 99, Computer Graphics Proceedings, Annual Conference Series, pp. 57-64, 1999.

Nasri, A., "Sketch-Based Subdivision Models", Eurographics Symposium on Sketch-Based Interfaces and Modeling—SBIM '09, vol. 1, p. 53, New York, New York, USA, 2009, ACM Press.

Schaefer, S., et al., "Lofting Curve Networks using Subdivision Surfaces", Eurographics Symposium on Geometry Processing (2004), pp. 103-114.

\* cited by examiner

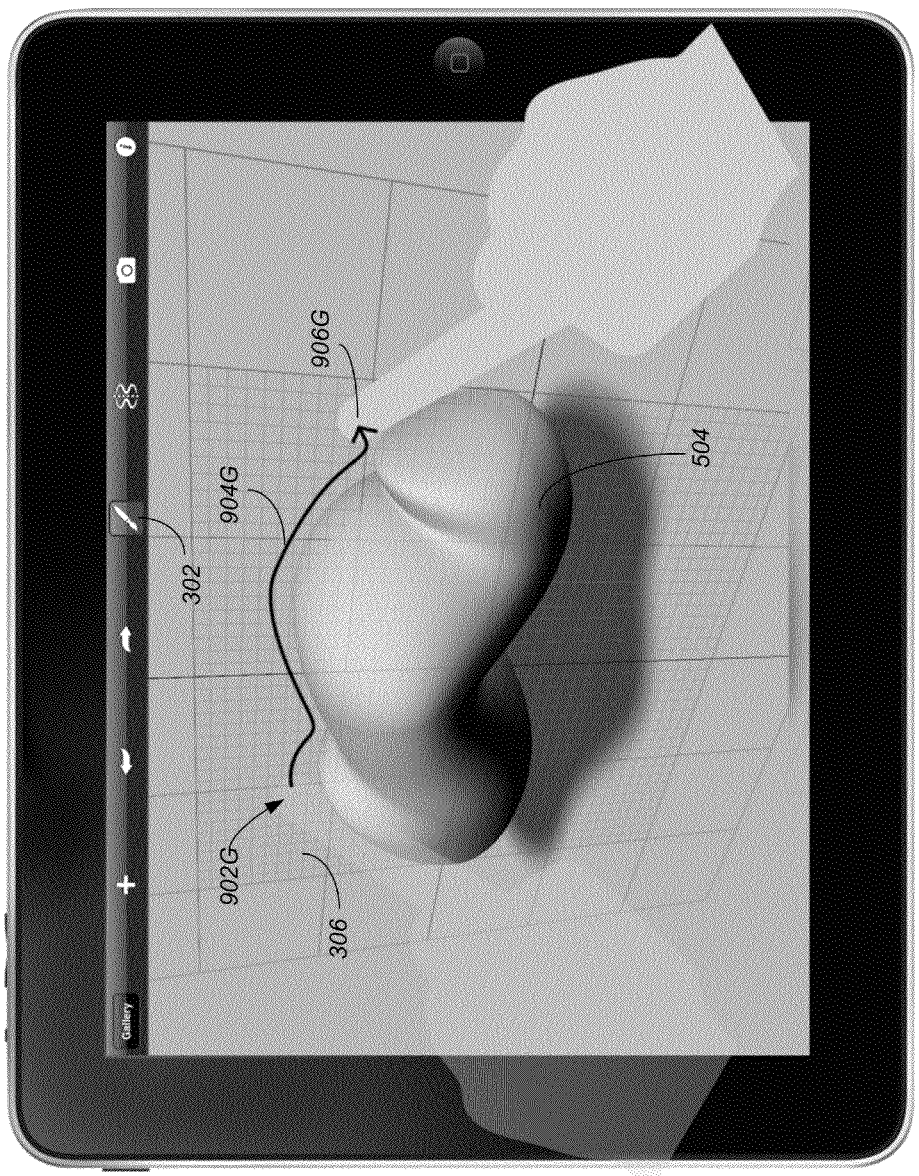

DYNAMIC CREATION AND MODELING OF SOLID MODELS

CROSS-REFERENCE TO RELATED APPLICATIONS

This application is related to the following co-pending and commonly-assigned patent applications, which applications are incorporated by reference herein:

U.S. patent application Ser. No. 13/085,195 filed on Apr. 12, 2011, entitled "Transform Manipulator Control", by Gregory W. Fowler, Jason Bellenger, and Hans-Frederick Brown;

U.S. patent application Ser. No. 13/351,116 filed on the same date herewith, entitled "THREE DIMENSIONAL CONTRIVER TOOL FOR MODELING WITH MULTI-TOUCH DEVICES", by Gregory W. Fowler, Jason Vincent Ma, and Hans-Frederick Brown; and U.S. patent application Ser. No. 13/351,133 filed on the same date herewith, entitled "GESTURES AND TOOLS FOR CREATING AND EDITING SOLID MODELS", by Gregory W. Fowler, Jason Vincent Ma, and Hans-Frederick Brown.

BACKGROUND OF THE INVENTION

1. Field of the Invention

The present invention relates generally to three-dimensional (3D) modeling, and in particular, to a method, apparatus, and article of manufacture for dynamically creating and modeling/editing a solid model (e.g., on a multi-touch device).

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Many 3D modeling and drawing applications are used in both desktop and multi-touch devices. However, none of the existing multi-touch 3D modeling or drawing applications provide a comprehensive 3D modeling system that take advantage of the multi-touch capabilities available across multiple mobile devices, without interfering with basic 3D navigation or requiring proficiency in the "art" of 3D modeling. Further, none of the prior art modeling systems provide the ability to dynamically create and dynamically modify/edit a 3D solid model (e.g., via user gestures). To better understand the problems and deficiencies of the prior art, a description of prior art modeling applications and activities may be useful.

Some prior art modeling applications (e.g., the Spaceclaim Engineering™ application), have explored multi-touch interactions in the context of 3D modeling tasks. However, such prior art applications mimic the interaction available via a mouse pointer. These interactions are not tailored for laymen to use without 3D modeling experience. Many of the operations also require two hand interactions that may not be adequate for smaller devices and require more muscle memory. Further, prior art applications involve multiple steps in which 3D solid models are not created dynamically in real-time consistent with the user's gestures.

In some cases, specific creation tools (e.g., extrude, revolve, offset, etc.) may have been implemented for multi-touch use. However, such creation tools are all static modality tools or commands that require proper selection. The tools are detached from the 3D navigation experience and do not fully take advantage of the multi touch input devices.

In view of the above, it may be understood that 3D modeling activities and tasks generally imply and require an understanding/mastering of concepts such as coordinate systems, tool operations, tool selection sequence, and validity of selections. Accordingly, what is needed is the capability to easily perform a variety of modeling operations (including creation, modification, and navigation) on a multi-touch input device in a dynamic manner without multiple steps or selection requirements.

SUMMARY OF THE INVENTION

Embodiments of the invention provide a 3D contriver tool that provides the ability for a user to dynamically (in real-time) create and reshape a 3D geometric form on a multi-touch device based on a finger input gesture. Further, embodiments of the invention introduce new multi-touch gestures and interactions that combine multiple concepts into a simple, predictable workflow that mimics how brushes are used on an empty canvas. By simply touching a designated space, the user can rapidly and dynamically create forms without having to worry about tool sequencing, profiles selection, direction, etc.

Additionally, once a form is laid down in space, the user can continue to dynamically adjust the form/geometry without having to launch an edit tool or invoke a special mode. By simply re-stroking the form, the system detects a modification operation, automatically switches to that operational mode, and allows the user to dynamically reshape the form.

Furthermore, embodiments of the invention introduce a "soft" 3D navigation (tumbling) activation/deactivation method that does not require the usage of multi-finger gestures or special modes. This transient navigation consists of tracking multi-touch inputs outside a virtual modeling box/plane that provides a 3D modeling environment that flows naturally without enforcing mode/tool switching or difficult clutch gestures to learn.

All of the above functionality is presented to the user as a single tool that is highly context sensitive and used in a dynamic manner to both create and modify a solid model. The tool exposes all of the above interactions without interfering with 3D navigational activities (e.g., pan, zoom, tumble).

BRIEF DESCRIPTION OF THE DRAWINGS

Referring now to the drawings in which like reference numbers represent corresponding parts throughout:

FIG. 9G illustrates an example of a user continuing to interact using a modeling tool with the model form of FIG. 9F in a different plane in accordance with one or more embodiments of the invention;

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention provide a multi-touch 3D modeling system that is based on the idea of using life-like drawing tools on a blank canvas. A single tool provides the ability to automatically control creating, positioning, editing, scaling, and posing based on the view direction and multi-touch events. All of these operations are provided within the same context and without exiting the tool for 3D navigation operations.

Accordingly, a user is provided with access to a number of modeling interactions (e.g., creating/editing) that dynamically create base geometry, that can be refined and later dynamically sculpted using 3D modeling tools. With the single tool (referred to herein as a 3D contriver tool), the user can explore new 3D creations without requiring special commands or modes. Such an approach maintains the artistic flow that users appreciate from prior art brushing and stroking systems.

Hardware Environment

Figure 1:
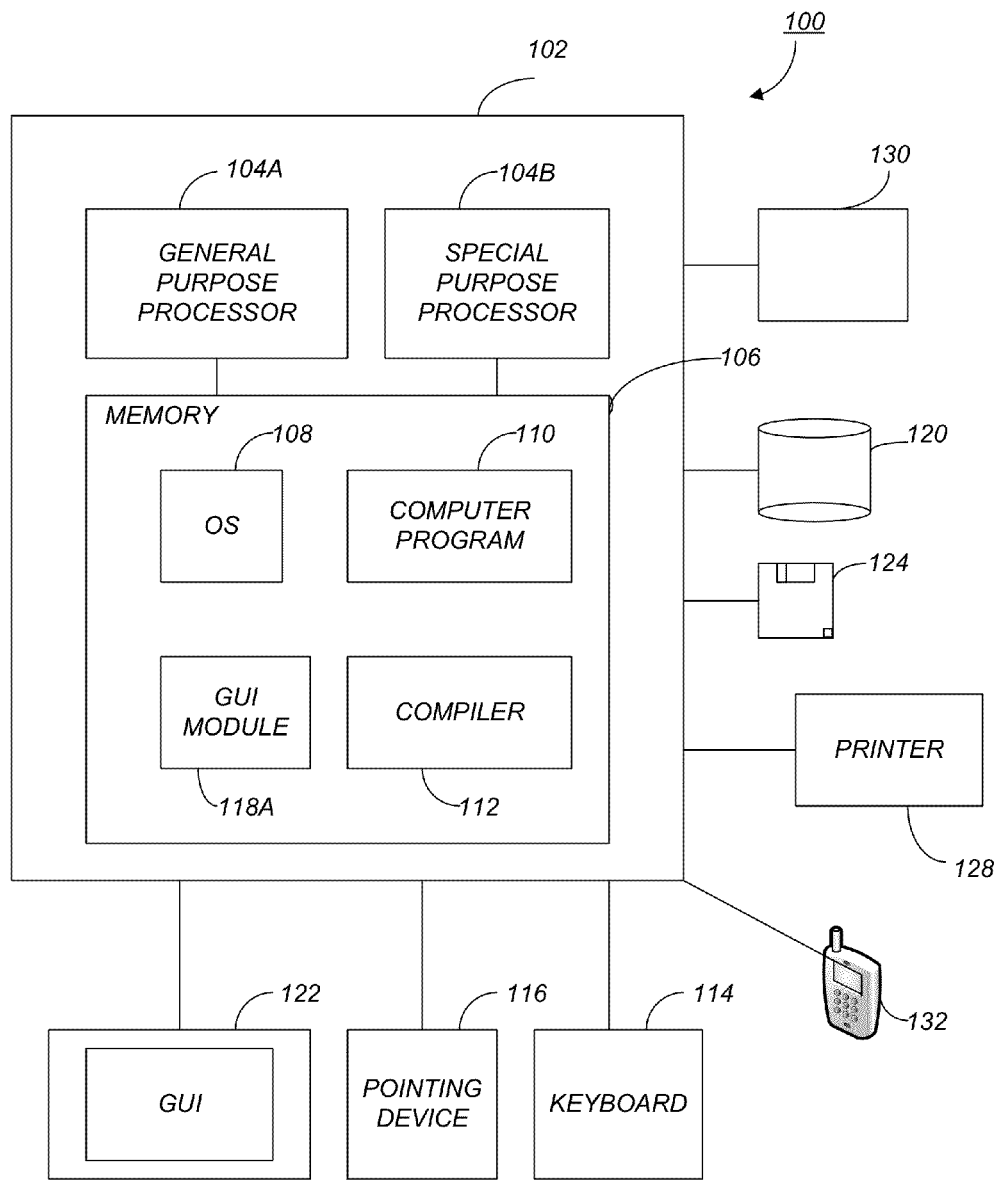
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to and/or integrated with other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, iPod™, Nook™, portable digital video player, cellular device, personal digital assistant, etc.).

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers 102.

In one embodiment, instructions implementing the operating system 108, the computer program 110, and the compiler 112 are tangibly embodied in a non-transient computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Figure 2:
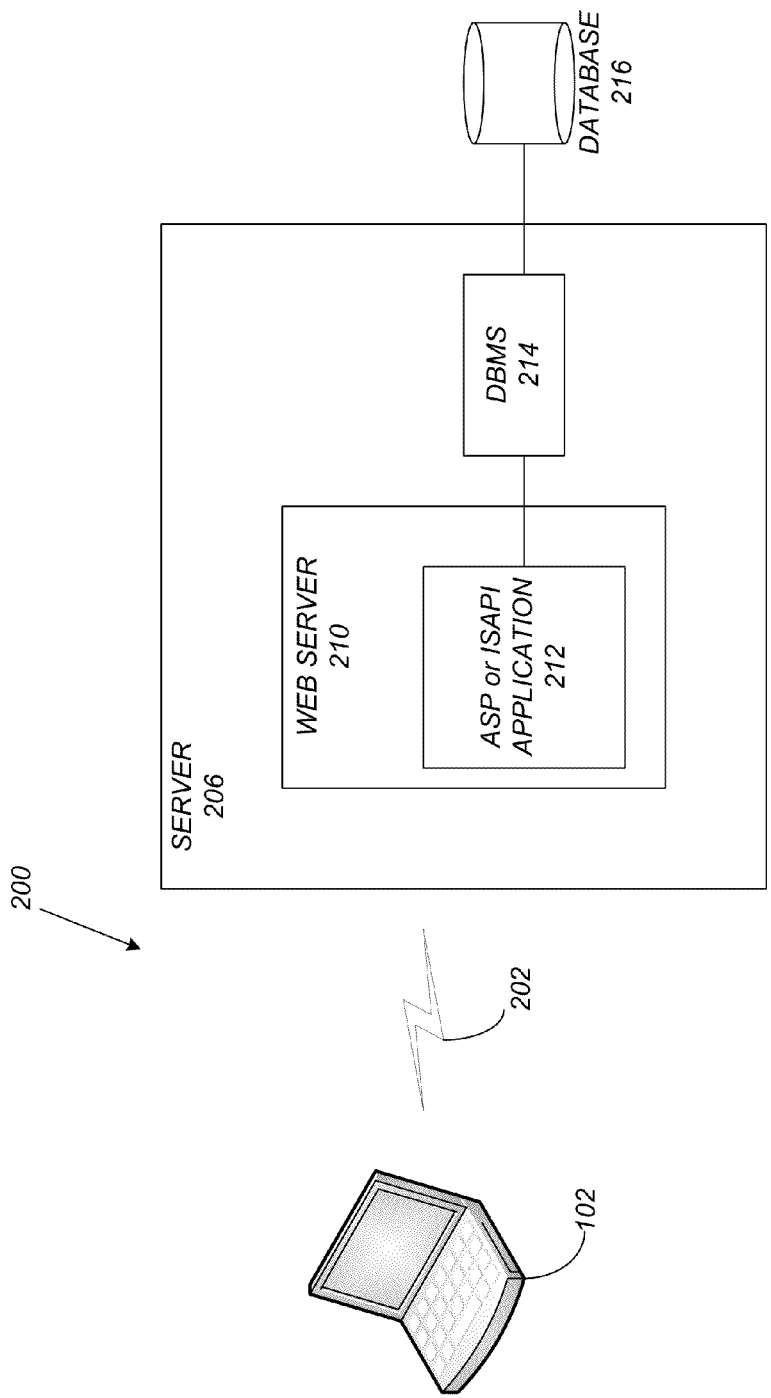
FIG. 2 schematically illustrates a typical distributed computer system using a network to connect client computers to server computers in accordance with one or more embodiments of the invention.

FIG. 2 schematically illustrates a typical distributed computer system 200 using a network 202 to connect client computers 102 to server computers 206. A typical combination of resources may include a network 202 comprising the Internet, LANs (local area networks), WANs (wide area networks), SNA (systems network architecture) networks, or the like, clients 102 that are personal computers or workstations, and servers 206 that are personal computers, workstations, minicomputers, or mainframes (as set forth in FIG. 1).

A network 202 such as the Internet connects clients 102 to server computers 206. Network 202 may utilize ethernet, coaxial cable, wireless communications, radio frequency (RF), etc. to connect and provide the communication between clients 102 and servers 206. Clients 102 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 102 may be downloaded from server computer 206 to client computers 102 and installed as a plug in or ACTIVEX™ control of a web browser. Accordingly, clients 102 may utilize ACTIVEX™ components/component object model (COM) or distributed COM (DCOM) components to provide a user interface on a display of client 102. The web server 210 is typically a program such as MICROSOFT'S INTERNENT INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 102 instead of communicating/obtaining the information from database 216 across network 202. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the term "user computer", "client computer", and/or "server computer" is referred to herein, it is understood that such computers 102 and 206 may include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 102 and 206.

Software Embodiment Overview

Embodiments of the invention are implemented as a software application/3D contriver tool on a client 102 or server computer 206. Further, as described above, the client 102 or server computer 206 may comprise a thin client device or a portable device that has a multi-touch-based display.

The 3D contriver tool for multi-touch devices can be grouped in different clusters of functionality (that are described in the present application and/or the related applications identified and cross referenced above) as follows:

1. Modeling Space and Tool Creator
  i) Modeling Box & Dominant Plane
  ii) Thumbing/Orbiting and Navigation
  iii) Empty Space Brush Modeling
  iv) Re-Stroking in Original Plane Interactions
  v) Re-Stroking in Different Plane Interactions
  vi) Two Finger Modeling 2. Modeling from a Face
  i) From Face Brush Modeling
  ii) Re-Stroking in Original Plane Interactions
  iii) Re-Stroking in Different Plane Interactions
  iv) Scaling
  v) Two Face Bridging
  vi) Bridging Re-Stroking
  vii) Mirroring Modeling Space and Tool Creator Embodiments of the invention (e.g., system) will provide a single tool that permits multiple dynamic modeling operations and navigation within the same context without requiring complex gestures or modes.

Modeling Box and Dominant Plane

Figure 3:
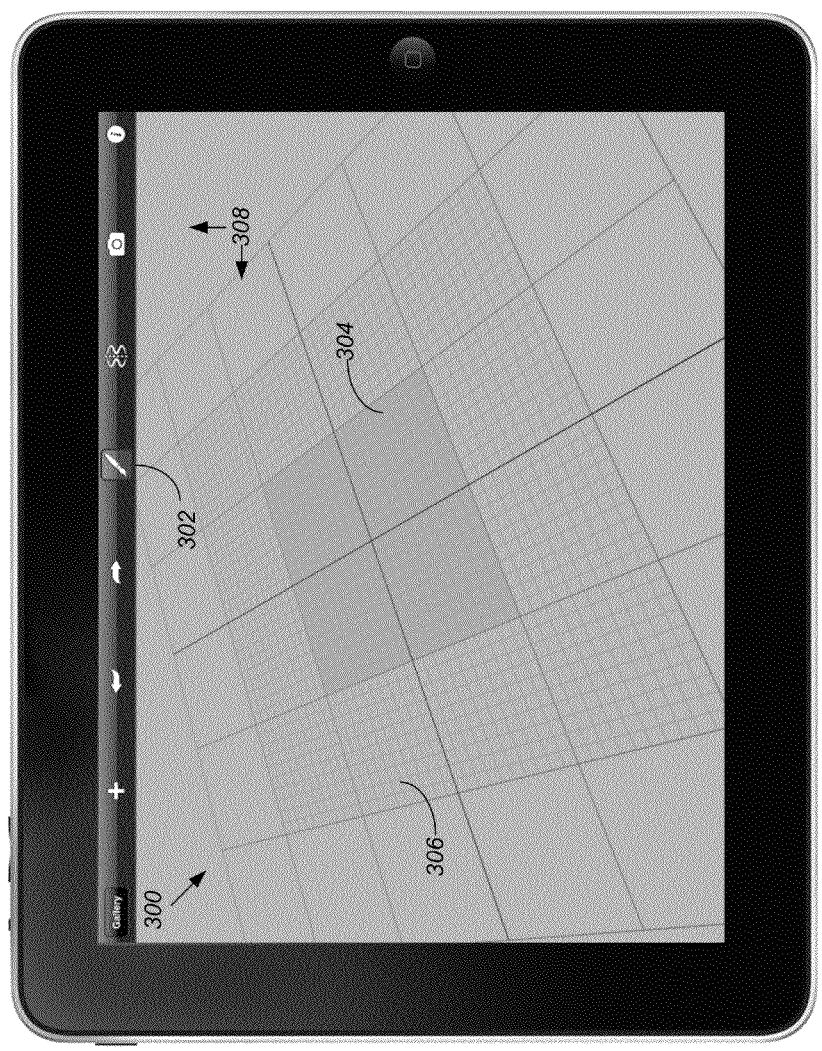
FIG. 3 illustrates a visual representation for a grid system (on a multi-touch device) that controls which gestures are either captured as modeling operations or navigational operations, specifically tumbling/orbiting in accordance with one or more embodiments of the invention.

FIG. 3 illustrates a visual representation for a grid system (on a multi-touch device) that controls which gestures are either captured as modeling operations or navigational operations, specifically tumbling/orbiting. In FIG. 3, the user has activated the modeling tool 302. Once the modeling tool 302 has been selected, the system displays a grid 300 composed of three specific regions.

The center region 304 represents an area that will generate geometry if a touch event is detected (see below for more detail regarding modeling operations).

The first outer region 306 represents an area that will either trigger a restocking operation (re-brushing the geometry after the initial creation) when a form is active or trigger a tumbling/orbit navigation if no form is active (see below for more details on re-stroking modeling operations).

The second outer region/fall-off grid 308 represents an area that will always trigger a tumbling/orbit navigation if a touch event is detected. Any other touch event detected outside of the fall-off grid 308 will also trigger tumbling/orbit navigation.

Embodiments of the invention perform the desired operation based on where the touch event commences and not where the gesture following the touch event proceeds. Thus, merely by commencing a touch event/gesture at a particular location with respect to the grid 300, a particular operation is performed. The FIGs. and description that follow illustrate examples of the different operations that may be performed based on the grid 300.

Tumbling/Orbiting and Navigation

Figure 4B:
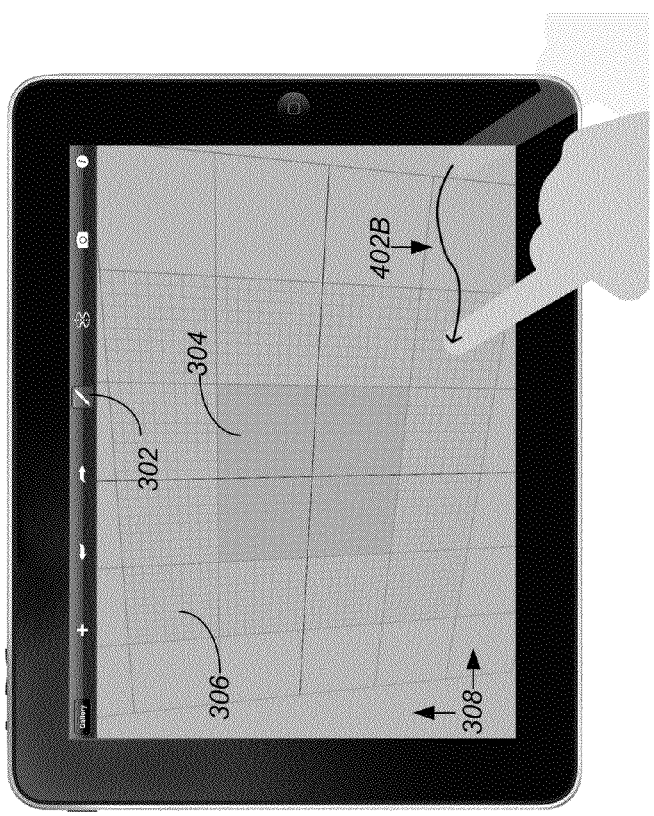
FIGS. 4A and 4B illustrate a tumbling/orbiting operation where a grid system adapts itself based on the viewing angle in accordance with one or more embodiments of the invention.
Figure 4A:
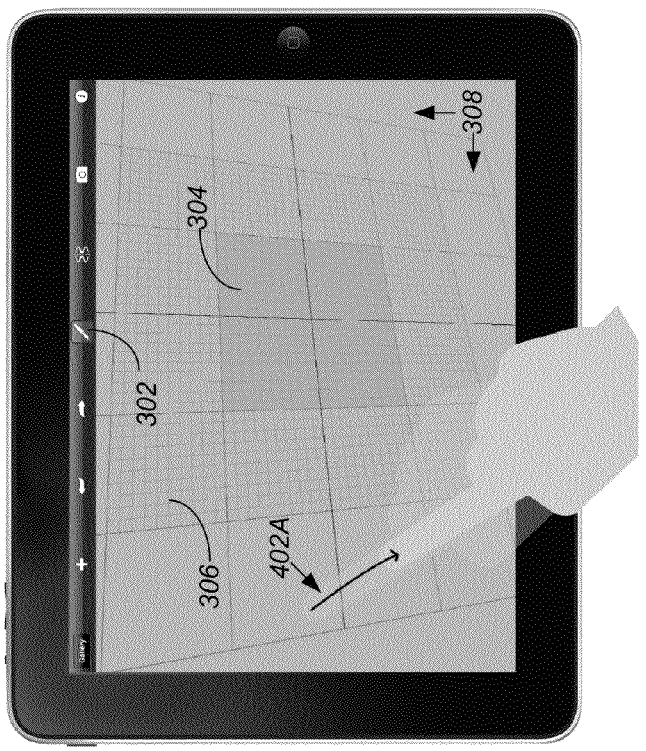

FIGS. 4A and 4B illustrate a tumbling/orbiting operation based on a touch event occurring in region 308 of the grid 300. FIGS. 4A and 4B further illustrate how the grid system adapts itself based on the viewing angle. The general idea is to always display the optimal grid representation, derived from the current viewing angle. Accordingly, depending on how the user is viewing the grid 300, the grid may be flipped and place the user in an optimal viewing position/angle. The current viewing angle may be determined as set forth in a dominant plane as described in co-pending patent application Ser. No. 13/085,195, which is incorporated by reference herein.

To respond to the user tumbling/orbiting in space, embodiments of the invention dynamically switch to one of the dominant planes: XY, XZ, YZ and update the graphical representation of the grid accordingly.

FIG. 4A shows the final state of the grid system while the modeling tool 302 is active. The captured gesture 402A occurs entirely outside of the grid 300 (i.e., in region 308), thus invoking a tumble/orbit. In other words, the captured gesture 402A begins and ends in area 308 and not within region 304 and/or 306. The resulting viewing angle determines that the XZ plane is dominant and all modeling operations in region 304 or any re-stroking operation in regions 304-306 will be projected to the XY plane.

FIG. 4B shows the final state of the grid system while the modeling tool 302 is active. The captured gesture 402B begins outside of the grid 300 (i.e., in region 308) thus invoking a tumble/orbit. In other words, the captured gesture begins outside of the grid system in region 308 but proceeds into region 306. The resulting viewing angle determines that the YZ plane is dominant and all modeling operations in region 304 or any re-stroking operation in regions 304-306 will be projected to the YZ plane.

In view of FIGS. 4A and 4B, it may be noted that embodiments of the invention evaluate the action that is to be executed based on where the touch event begins/commences rather than where the touch event proceeds or ends. Accordingly, in FIGS. 4A and 4B, since the touch event/gesture 402 begins in area 308, a navigation (e.g., tumbling/orbiting) operation is performed.

Empty Space Brush Modeling Interface

Figure 5:
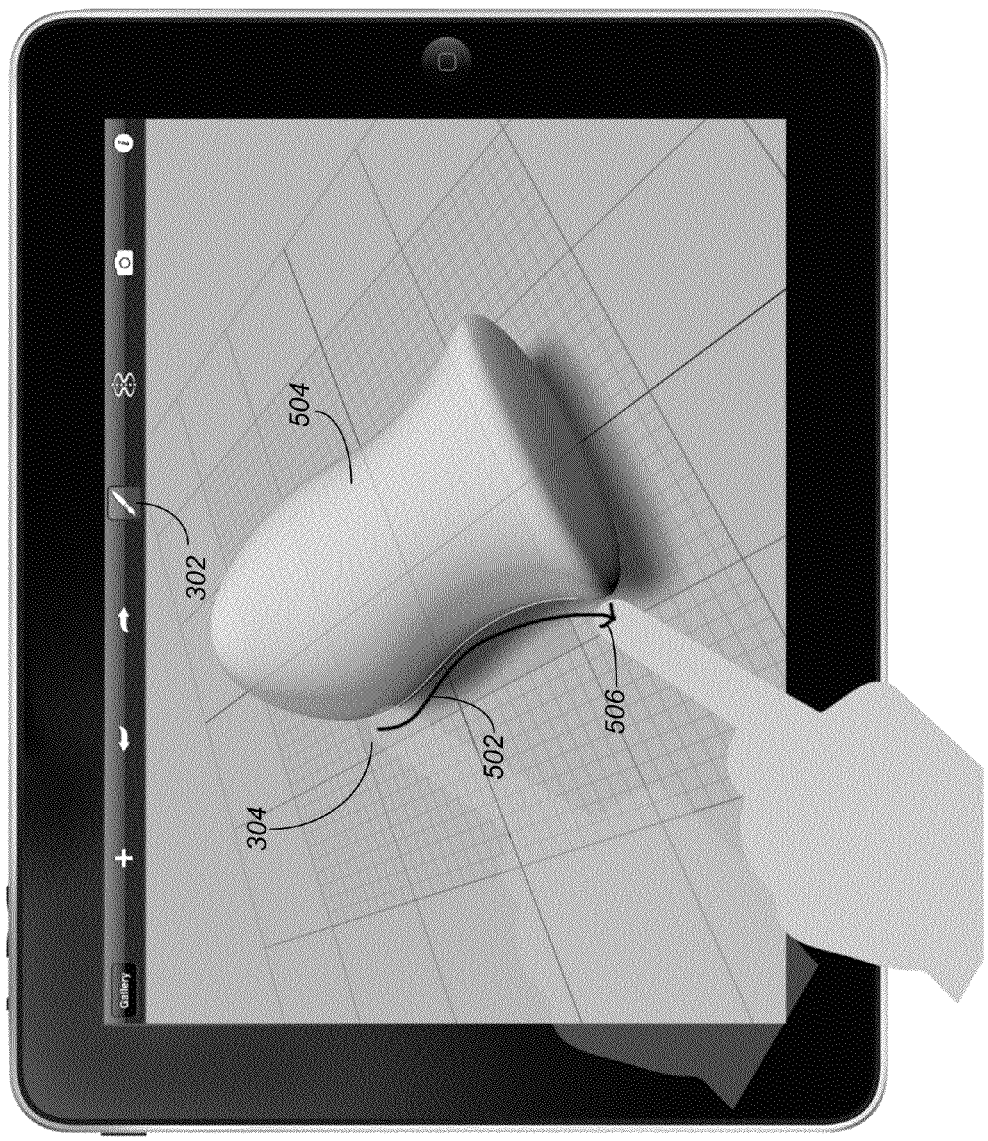
FIG. 5 illustrates an exemplary modeling operation that creates a 3D form based on a modeling operation performed on empty space from within a region in accordance with one or more embodiments of the invention.

FIG. 5 illustrates an exemplary modeling operation that dynamically creates a 3D form based on a modeling operation performed on empty space from within region 304. In FIG. 5, the user has activated the modeling tool 302, and the system displays an XY grid, determined by the current viewing angle.

The user starts brushing from a position inside the modeling grid 304. As the user drags a finger along any path 502, the system dynamically creates a 3D form 504. The form shaping is interactive and updates the form 504 every time it samples the gesture 502. Such form shaping is performed dynamically in real-time as the user performs the stroke/gesture. Accordingly, as the user is moving a finger, the model is changing. In the prior art, the ability to dynamically create a model in such a manner was not provided. Instead, prior art users were required to draw a curve, select the drawn curve, and select a profile. Thereafter, the user would perform a sweep/jigging operation/process. Such a sweep operation is not dynamically created as the user inputs a gesture but instead is based on an already drawn curve that is selected by the user.

Once the user finishes brushing (i.e., at 506), describing the path 502, the system finishes the shaping of the 3D form 504. The user can then tumble/orbit (e.g., as described above with respect to FIGS. 4A and 4B) or re-stroke the 3D form 504 (e.g., as described below).

Thus, since the gesture 502 commenced in region 304, a creation/modeling operation is performed based on the user's gesture 502. As illustrated, a 3D form 504 is dynamically created and conforms to the shape of the gesture/stroke 502. To perform the modeling creation operation, the user did not need to select a creation operation (e.g., from a menu or otherwise). Instead, the user simply began the gesture 502 within region 304. In response, a 3D form 504 is displayed on the grid 300 and is dynamically updated to conform to the stroke 506 while the stroke 506 is drawn. Again, since the gesture/stroke 502 began inside of region 304, it doesn't matter if the stroke 502 proceeds outside of region 304. Instead, what enables the modeling operation is where the stroke 502 commences.

Accordingly, the grid system 300 of the invention enables the user to perform a desired operation merely by beginning a gesture in a particular area/region of the grid system 300.

Empty Space Brush Modeling Implementation Details

To create the 3D form in real time, a pair of curves may be created and used to produce a generalized tube surface that interpolates both curves simultaneously. Embodiments of the invention may utilize a Catmull-Clark subdivision surface as the tube surface. With such a subdivision surface, the problem reduces to building an appropriate base mesh whose limit surface shall be the tube surface that interpolates the given curves.

Embodiments of the invention assume that such curves are already in a form ready to use and that the curves have compatible lengths, orientation, and structure. Further, both curves may be required to be uniform cubic b-splines that have the same number of spans. Having such a requirement may be necessary because the CV (control vertex) hulls of the curves may be used to guide the building of the base mesh.

Many works of curve-interpolating subdivision surfaces can be found in academia. Generally, they fall into the following categories: those that build the base mesh specifically for the curve to be interpolated ([1]), [8], [5], [6]), those that tag edges of an existing base mesh, and have enhanced rules of subdivision ([2]), or those that provide entirely new schemes ([3]).

In view of the above, the first step is that of building the base mesh that encompasses two polygonal complexes so that the final subdivision surface will interpolate both curves at once (e.g., see [5] and [6] for details regarding polygonal complexes). To configure the polygonal complex for one curve, embodiments of the invention build a section of a "polygonal complex" that interpolates a CV of the curve $c_0$ as:

$$m_0 = \frac{6c_o - t_0 - b_0}{4} \quad (1)$$

Figure 6B:
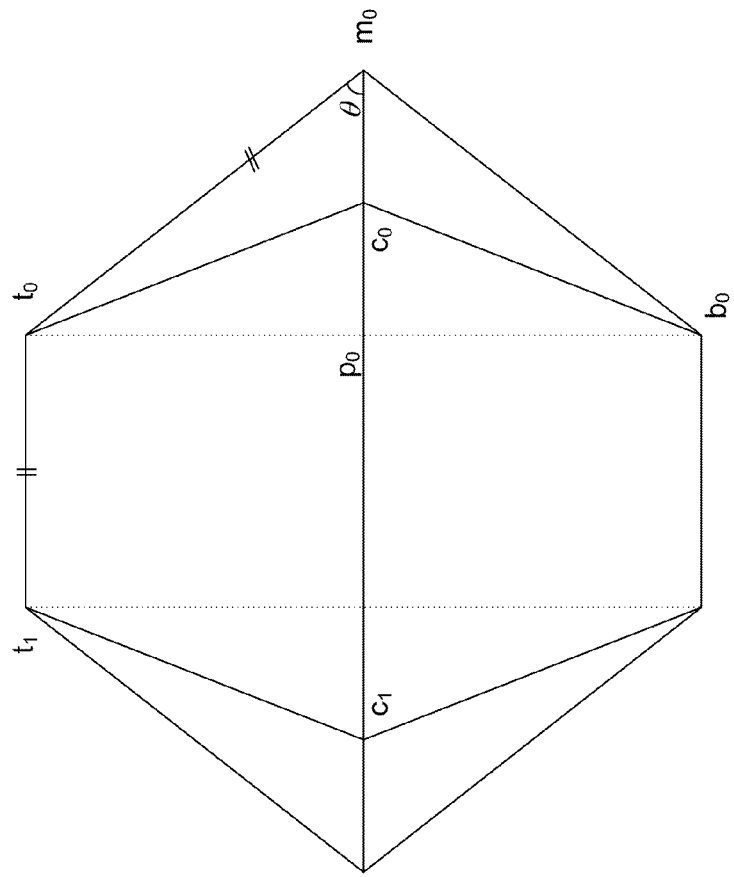
FIG. 6B illustrates both sides of "polygonal complex" in accordance with one or more embodiments of the invention.
Figure 6A:
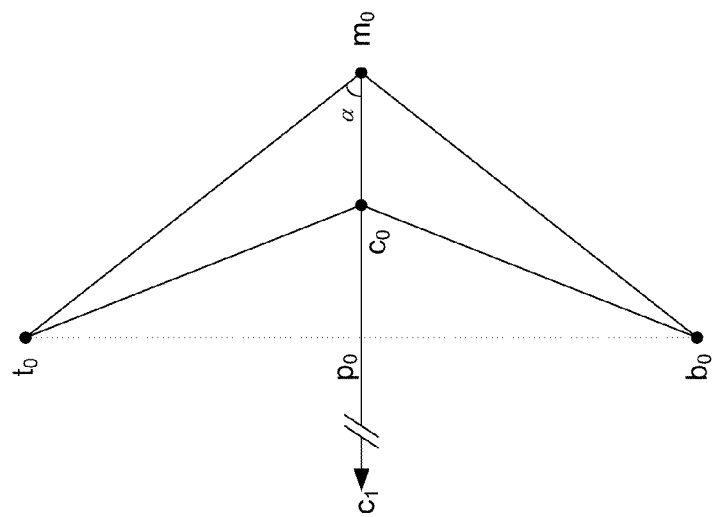
FIG. 6A illustrates a "polygonal complex" in accordance with one or more embodiments of the invention.

In other words, one must determine where to put the points $t_0$ and $b_0$ in order to place $m_0$. FIG. 6A illustrates a "polygonal complex" in accordance with one or more embodiments of the invention. FIG. 6A can be constructed such that:

$$(m_0 - c_1) \cdot (c_0 - c_1) = 1 \quad (2)$$

$$\|t_0 - p\| = \|b_0 - p\| \quad (3)$$

Let $o = \|t_0 - p\|$, $a = \|c_0 - p\|$, and $\vec{c} = \widehat{c_0 - c_1}$ (i.e., $\vec{c}$ is unit length). An expression of o may be found in terms of a.

$$o = \|m_0 - p\| \tan\theta \quad (4)$$
$$= (\|m_0 - c_0\| + \|c_0 - p\|) \tan\theta$$
$$= (\|m_0 - c_0\| + a) \tan\theta$$

Accordingly, $\|m_0 - c_0\|$ needs to be expressed in terms of a. Utilizing equation (1) above:

$$\|m_0 - c_0\| = \left\| \frac{6c_0 - t_0 - b_0}{4} - c_0 \right\| \quad (5)$$
$$= \left\| \frac{1}{2} c_0 - \frac{1}{4} t_0 - \frac{1}{4} b_0 \right\|$$

By construction, the vector $m_0 - c_0$ is parallel $\vec{c}$. Also, the restriction that $t_0$ and $b_0$ are symmetric across $\vec{c}$ implies that the projections of $c_0 - t_0$ and $c_0 - b_0$ onto $\vec{c}$ are equivalent (to $c_0 - p_0$). Therefore, to proceed onwards from (5), one only needs to consider the aforementioned projections:

$$\|m_0 - c_0\|_\| = \left\| \frac{1}{2} c_0 - \frac{1}{4} t_0 - \frac{1}{4} b_0 \right\| \quad (6)$$
$$= \left\| \frac{1}{4}(c_0 - t_0) + \frac{1}{4}(c_o - b_0) \right\|$$
$$= \frac{1}{2} \|c_0 - p_0\|$$
$$= \frac{1}{2} a$$

Thus, putting (6) and (4) together provides the following desired result:

$$o = 3/2 a \tan\theta \quad (7)$$

Making the profile a regular hexagon is the next step. Having figured out the value of o in terms of the single variable a, one may proceed to express the value of a in terms of the only known values of $c_0$ and $c_1$. FIG. 6B illustrates both sides of "polygonal complex" in accordance with one or more embodiments of the invention. From FIG. 6B (not drawn to scale), it is easy to see that:

$$\|c_1 - c0\| = 2a + \|t_1 - t_0\| \quad (8)$$

If the base mesh profile is to be a regular hexagon, the sides must have the same length. In particular, $$\|t_1 - t_0\| = \|t_0 - m_0\| \quad (9)$$

Referring to FIG. 6A, $t_0 - m_0$ is the hypotenuse of $\Delta m_0 t_0 p_0$, which means:

$$\|t_0 - m_0\| = \frac{o}{\sin\theta} \quad (10)$$

Therefore, if you account for (7) and apply some basic trigonometry:

$$\|t_1 - t_0\| = \frac{3 a \tan\theta}{2 \sin\theta} \quad (11)$$
$$= \frac{3a}{2\cos\theta}$$

If you substitute equation (11) into equation (8) and apply the knowledge that in a regular hexagon, $\theta = 60° \Rightarrow \cos\theta = \frac{1}{2}$, the equation for a can be had:

$$a = \frac{\|c_1 - c_0\|}{\frac{3}{2\cos\theta} + 2} \quad (12)$$
$$= \frac{\|c_1 - c_0\|}{5} \quad (13)$$

Thus, both o and a are now expressed purely by the distance between $c_0$ and $c_1$, which are the only inputs with which processing began. It is now a trivial exercise to construct the points $t_0$, $b_0$, and $m_0$ for the CV $c_0$, and similarly for $C_1$ (e.g., see FIG. 6B).

It may be noted that the hexagonal profile need not be regular. Using equations (7) and (12), one can vary o and a, within limits, to obtain variations of the shape of the tube. The limits on the length a is $[0, \frac{1}{2}\|c_1 - c_0\|)$. When $a = \frac{1}{2}\|c_1 - c_0\|$, the profile turns into a 4-sided profile, as described below. Furthermore, the polygonal complexes for both sides need not be symmetric: the restriction $\|c_0-p_0\|-\|c_1-p_1\|$ can be relaxed, so long as $\|c_0-p_0\|+\|c_1-p_1\|\leq\|c_1-c_0\|$. Then, any reasonable values for $o_0$ and $o_1$ can be chosen to create a lopsided 6-sided profile. Also, it is trivial to extend this construction method to (regular) 2N-sided polygons $N\geq 3$.

Figure 6C:
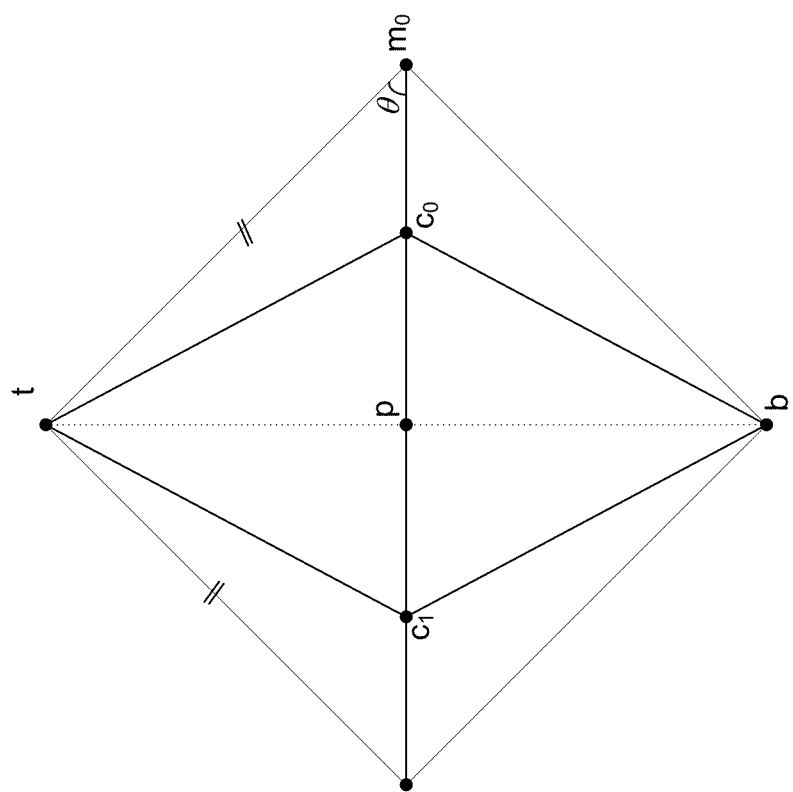
FIG. 6C illustrates using a square as the profile of the polygonal complex base mesh in accordance with one or more embodiments of the invention.

One can also imagine using a square as the profile of the polygonal complex base mesh as illustrated in FIG. 6C. In this case, $t_0$ and $t_1$ are now the same point (same for b's and p's). In FIG. 6C, they are now t, b, and p respectively. Now, because $\theta=45° \Rightarrow \tan\theta=1$, equation (7) simplifies to:

$$o=3/2a \qquad (14)$$

By inspection, p is now the midpoint between $c_0$ and $c_1$, so:

$$a = \frac{\|c_1 - c_0\|}{2}$$

Again, just like the case of the hexagonal profile, the 4-sided profile need not be a square. The point p can be located anywhere between $c_0$ and $C_1$, and then $o_t$ and $o_b$ can be different, even. However, this construction method can only yield a rhombic profile, and is not able to create a rectangular profile. A rectangular profile (where the angles at $m_0$, $m_1$, t, and b of the profile are 90°) can be created—but the derivation may have many variations depending on the constraints at hand.

To ensure end-point interpolation, various additional processing may be required. If both curve were closed, then simply creating the base mesh via polygonal complexes is sufficient to create a subdivision surface that interpolates the two closed curves. However, if the curves were open, then there needs to be extra work done to the polygonal complexes such that the subdivision surface would interpolate the open ends of the curves.

Some literature on the subject of curve-interpolating subdivision surfaces gloss over the case of the curve being open, instead choosing to focus on interpolating either closed boundary curves or networks of curves (the open ends of all curves are coincident with at least one other curve) (e.g., see [4] which describes subdivision surfaces interpolating open curves but is limited to Doo-Sabin [quadratic] surfaces).

In one or more embodiments of the invention, the CV hull of a cubic b-spline can be used as the base polygon for a Catmull-Clark subdivision curve. However, if the b-spline has full-multiplicity knots for the end CVs, the respective Catmull-Clark subdivision curve will ignore this and the resulting subdivision curve will not interpolate the end CVs as expected. Therefore, if one were to use the CVs of an open curve to generate the polygonal complex as described above, the resulting subdivision surface may also fail to interpolate the endpoints of the input curves.

Embodiments of the invention may apply the techniques described in [7] to modify the CV hull of the input open curves. Four techniques may be used to modify the end CVs of the cubic b-spline curve (e.g., see [7]). After experimentation, embodiments of the invention utilize a method that modifies the last two (2) CVs on either end of the hull to satisfy the so called "Bezier end-constraint":

$$B' = \frac{3B - C}{2} \qquad (16)$$

$$A' = C + 6(A - B) \qquad (17)$$

where A, B, and C are the last three (3) original CVs of the one end of the curve, and A' and B' are the modified CVs. Subsequently, the modified hulls are used to generate the polygonal complexes and base mesh, as described above.

Figure 7A:
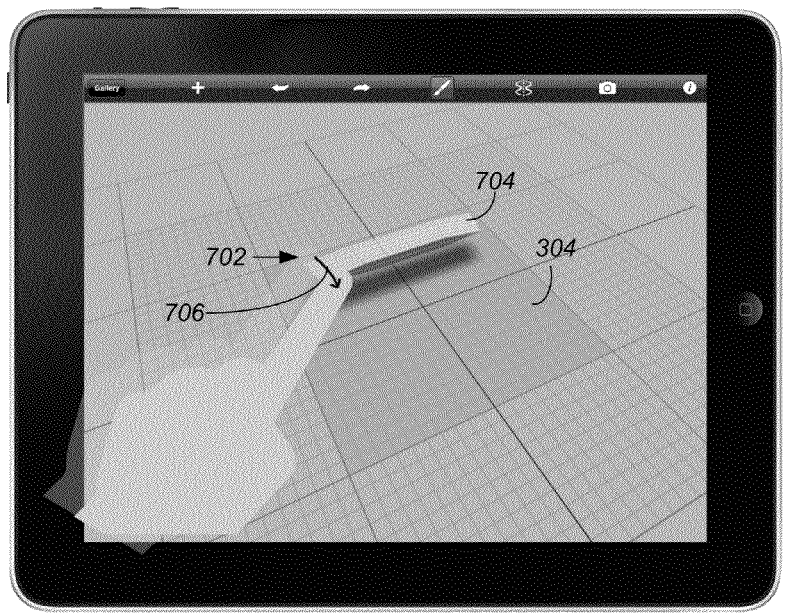
FIGS. 7A-7D illustrate the generation of a base mesh in accordance with one or more embodiments of the invention.
Figure 7B:
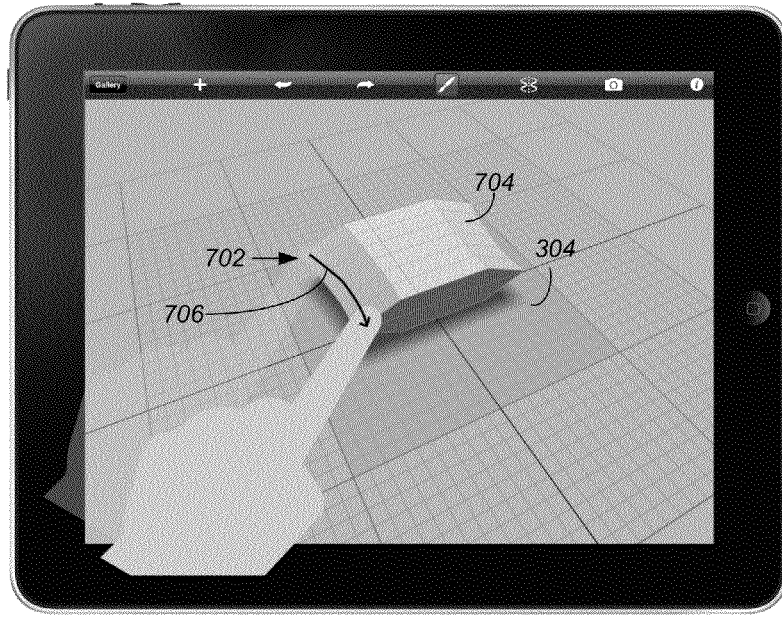
Figure 7C:
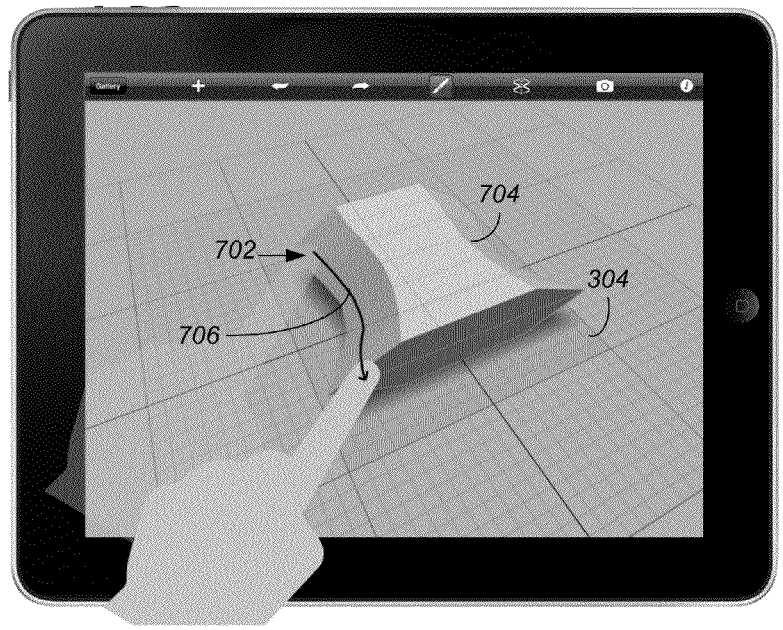
Figure 7D:
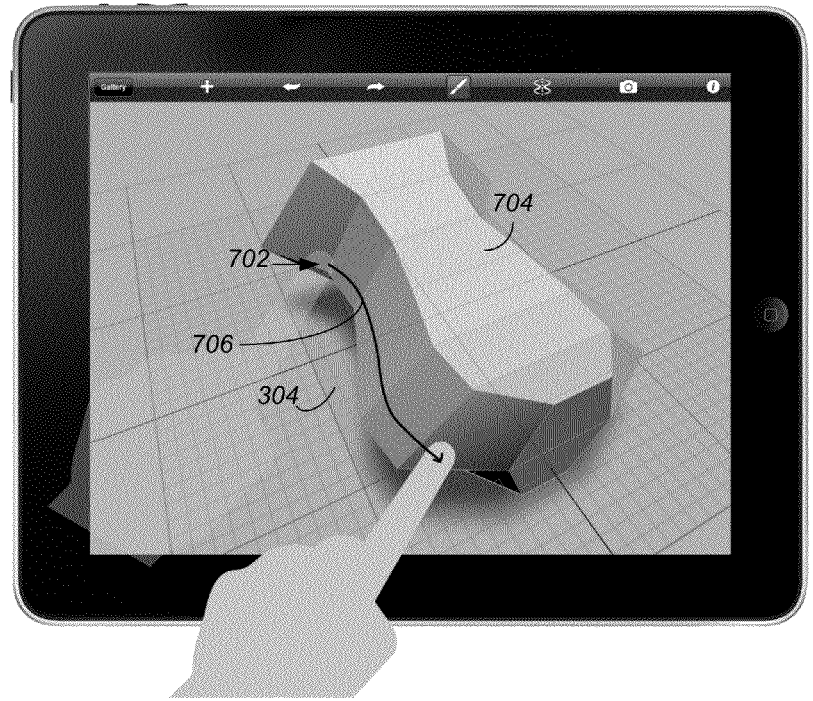

In view of the above, embodiments of the invention dynamically create the curves (as such curves are generated via user gesture) that are used to dynamically create a base mesh which in turn are dynamically used to create a tube surface that interpolates the given curves. Thus, the first step in such a process is to build a base mesh from the curves. FIGS. 7A-7D illustrate the generation of a base mesh in accordance with one or more embodiments of the invention. In FIG. 7A, the user begins the gesture at point 702 from within grid region 304. Since the user is within grid region 304, a creation operation is performed. As the user drags his finger, the system dynamically creates the base mesh 704. The shape of the base mesh 704 conforms to, and is consistent with, the user's gesture 706. As illustrated in FIGS. 7B, 7C, and 7D, the base mesh is continuously and dynamically created in real-time as the gesture 706 is input by the user and sampled. As illustrated in FIGS. 7A-7D, the CV hulls of the curves (i.e., dynamically created based on the user's gesture 706 in real-time), are used to guide the building of the base mesh 704.

Figure 8A:
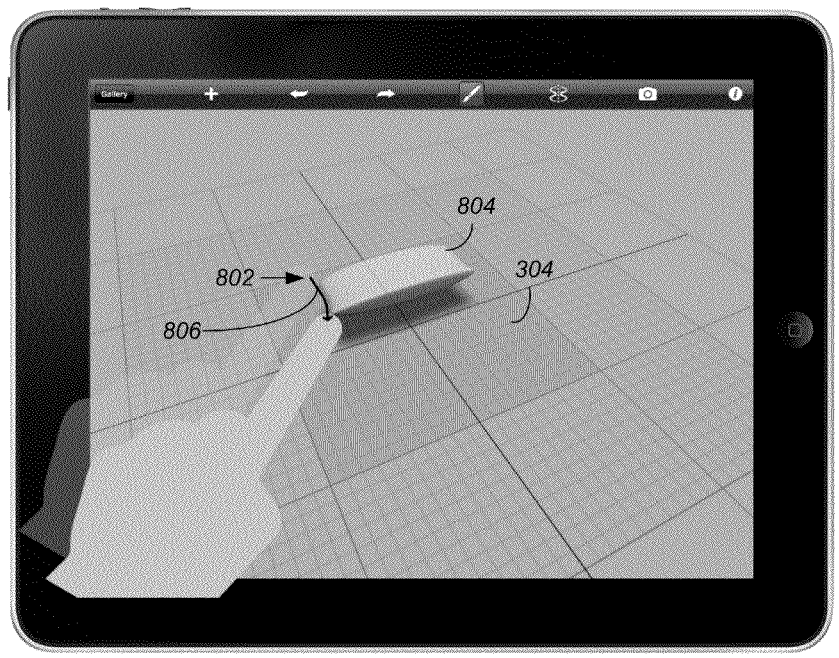
FIGS. 8A-8D illustrate a subdivision surface that is created dynamically consistent with a base mesh in accordance with one or more embodiments of the invention.
Figure 8B:
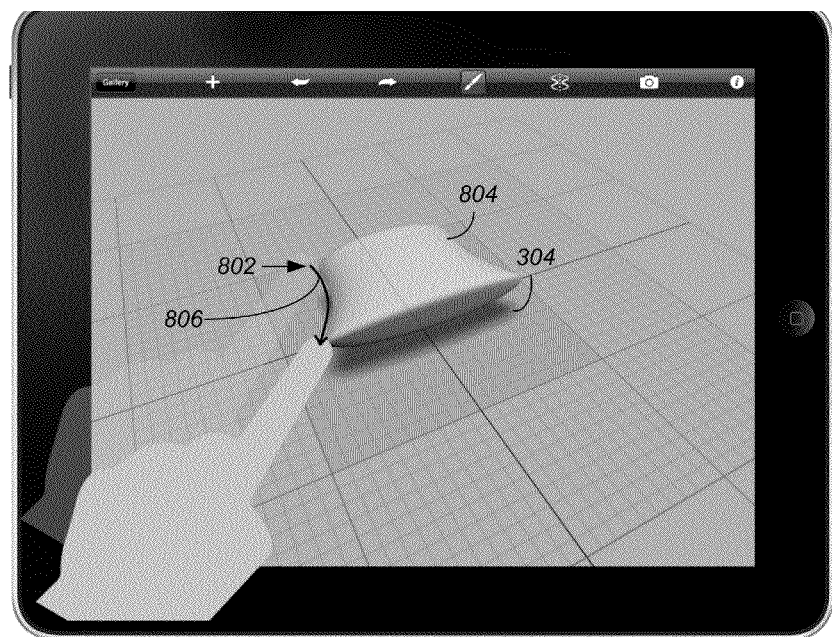
Figure 8C:
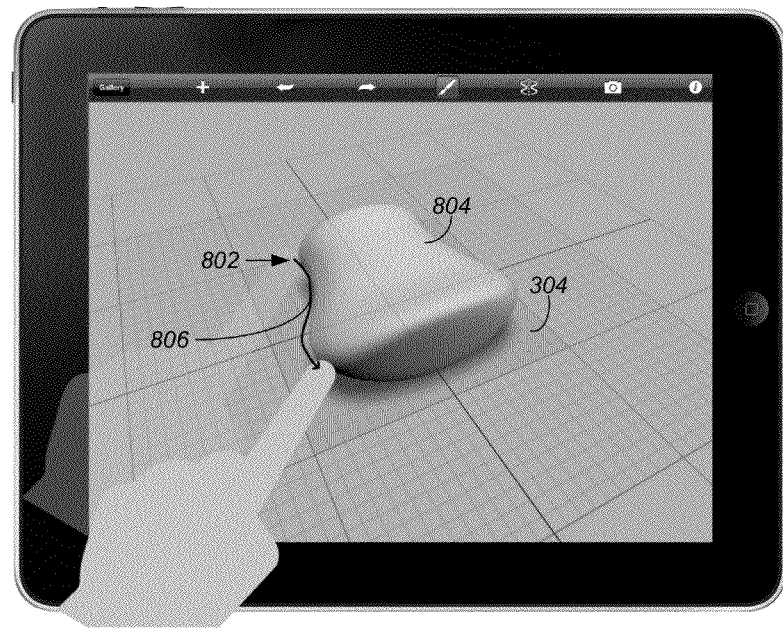
Figure 8D:
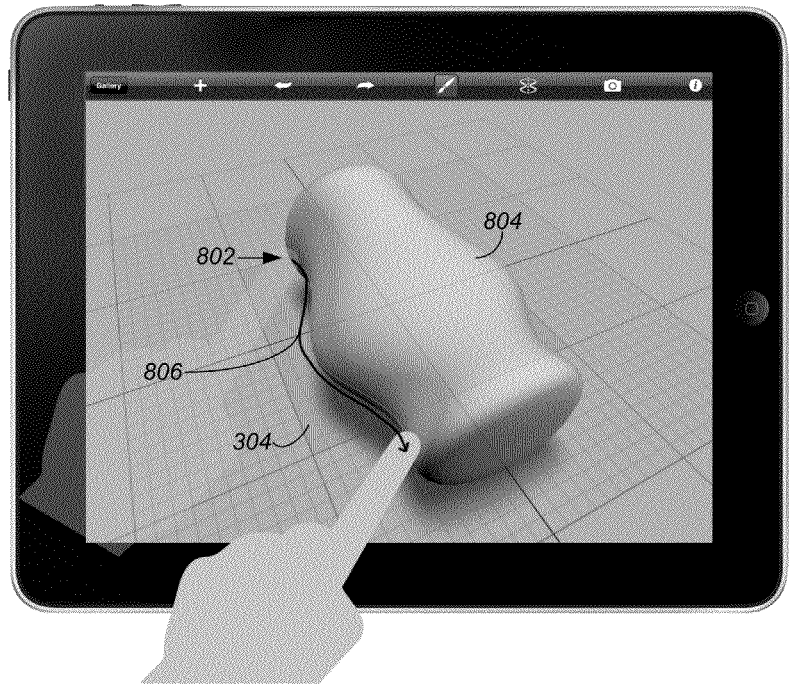

Once the base mesh is created, the limit surface of the base mesh is used as the tube surface that interpolates the given curves. As used herein, the limit surface is referred to as the sub-division surface. FIGS. 8A-8D illustrate a subdivision surface that is created dynamically consistent with a base mesh. In FIGS. 8A-8B, the user begins the gesture 806 at point 802 and the system dynamically creates the subdivision 3D surface 804 in real time (based on a base mesh). FIGS. 8C and 8D further illustrate the dynamic creation of the subdivision surface 804 in real-time as the gesture is input by the user.

In view of the above, it may be seen that the interpolation to create the subdivision surface is performed in real time. In this regard, the system utilizes the base mesh and as the gesture is input, the system determines the faces that should be added/interpolated based on the base mesh. Such interpolation and 3D subdivision surface creation is performed dynamically as the gesture is input as illustrated in FIGS. 8A-8D.

Re-Stroking in Original Plane Interactions

Figure 9A:
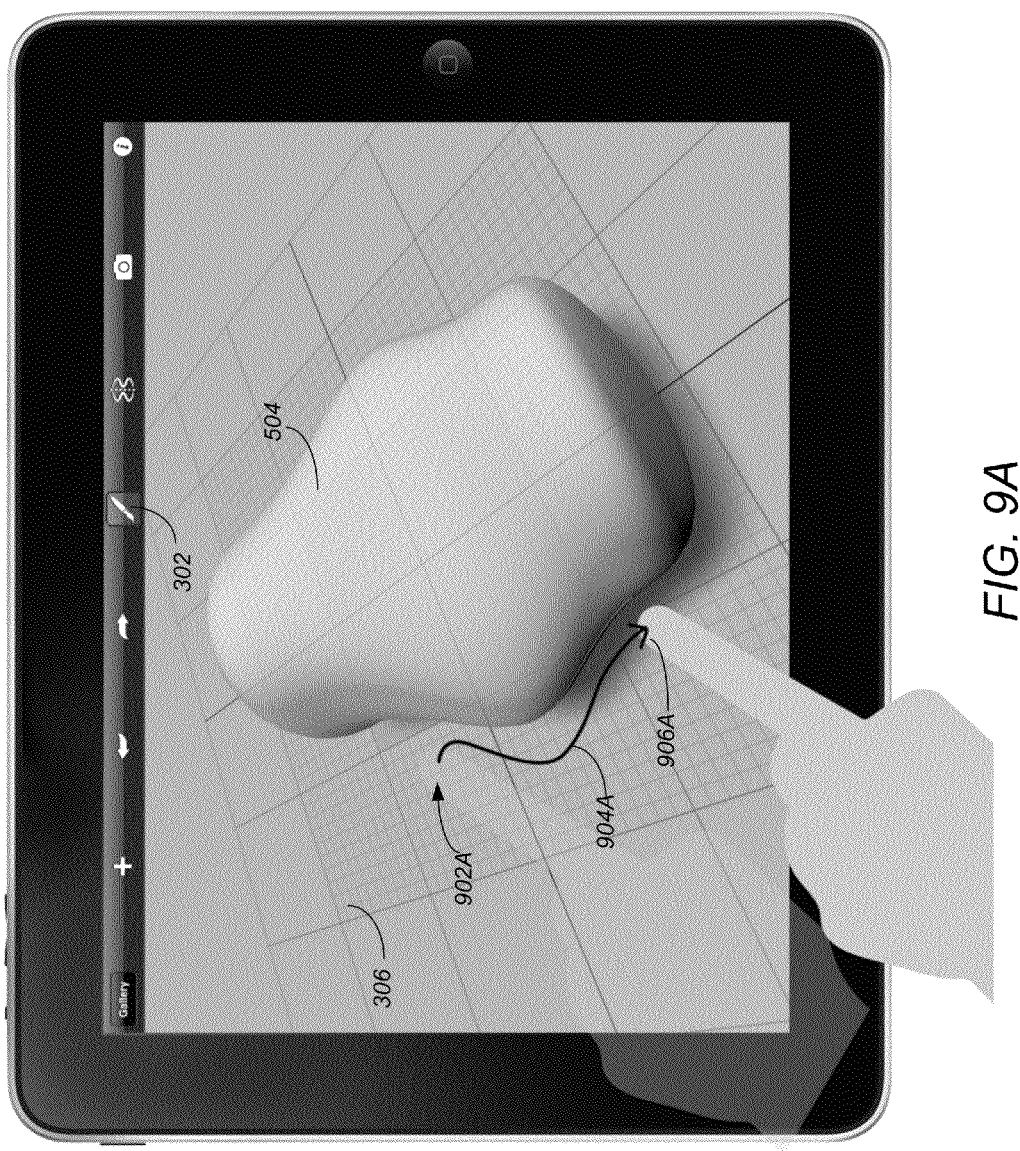
FIG. 9A illustrates an exemplary continued user interaction with the modeling tool and 3D form of FIG. 5(A) in accordance with one or more embodiments of the invention.
Figure 9B:
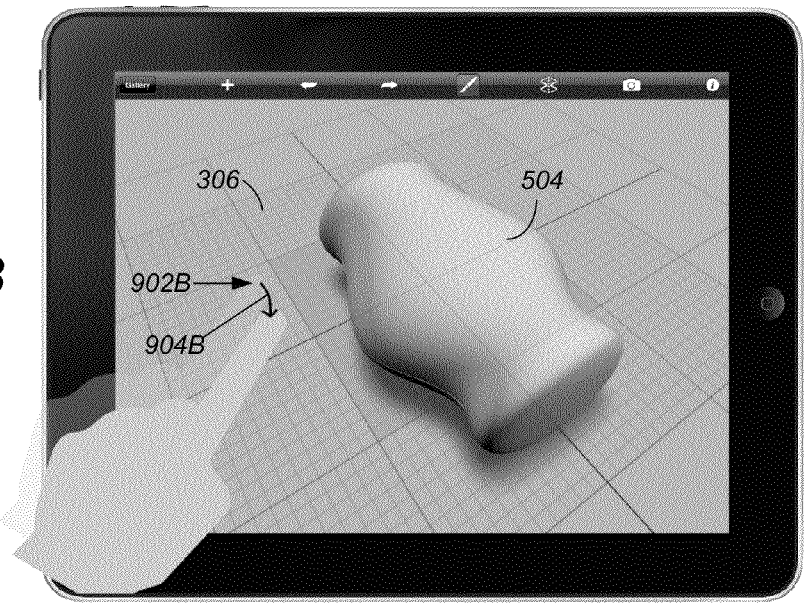
FIGS. 9B-9E illustrate dynamic restroking of the subdivision surface in accordance with one or more embodiments of the invention.
Figure 9C:
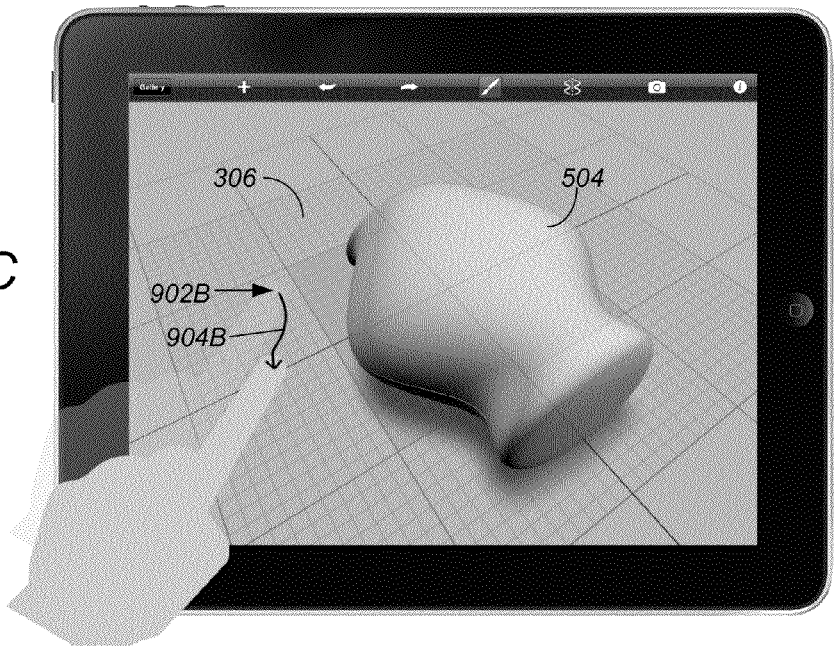
Figure 9D:
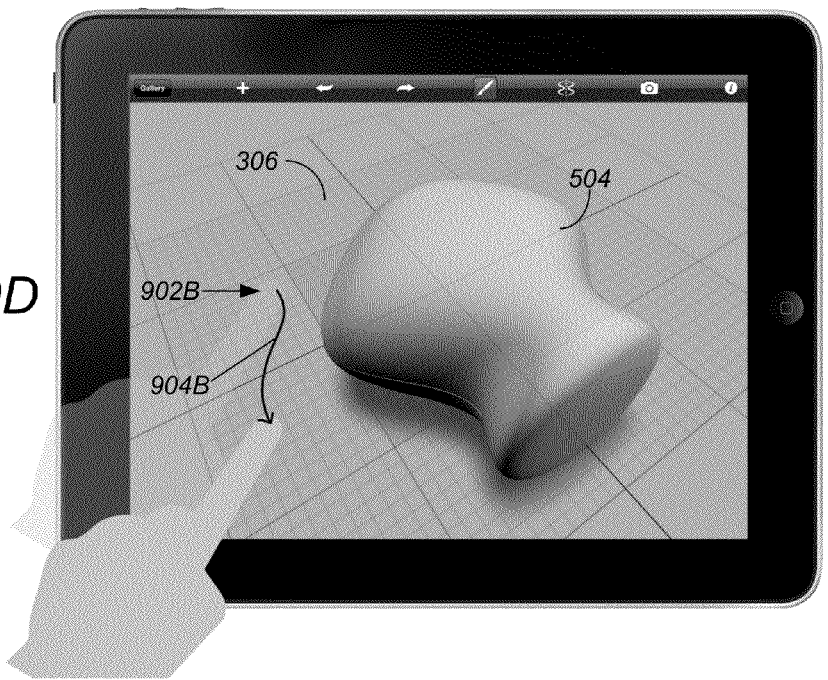
Figure 9E:
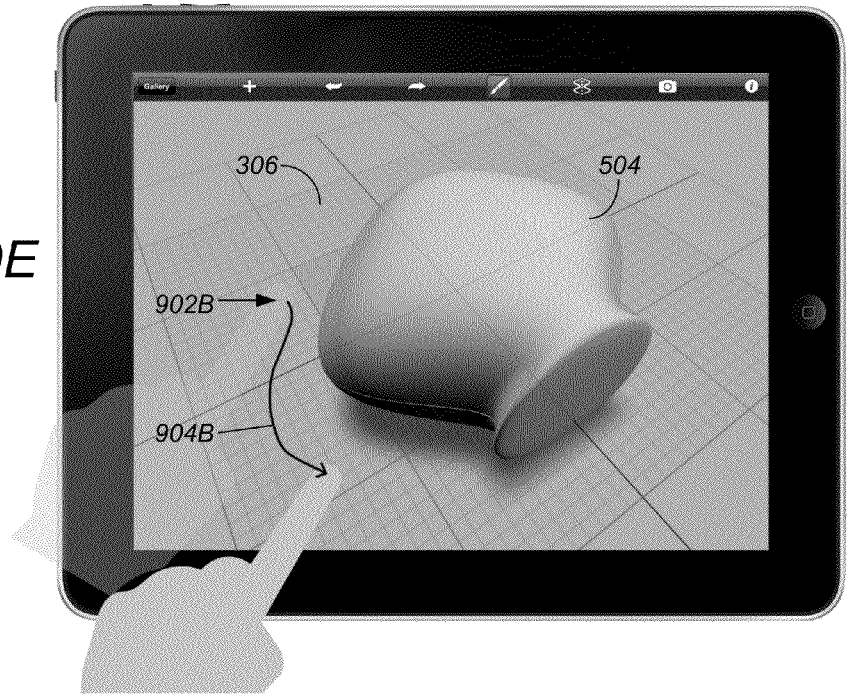

FIG. 9A illustrates an exemplary continued user interaction with the modeling tool 302 and 3D form of FIG. 5(A).

The user starts re-stroking from a position 902A inside the modeling grid 306. As the user drags his/her finger along any path 904A, the system dynamically re-shapes the 3D form 504. The form 504 re-shaping is dynamic, interactive, and updates the form 504 every time it samples the gesture (i.e., dynamically in real-time).

In FIG. 9A, the re-stroking modifies the 3D form 504 in relationship to the current XY grid. Once the user finishes re-stroking (i.e., at 906A) thereby describing the path 904A, the system finishes re-shaping the 3D form 504 and the user can then either tumble/orbit or re-stroke the 3D form 504.

Accordingly, as described above, since the operation/gesture 904A is commenced at a location 902A within area/region 306, a restocking operation is performed (i.e., since form 504 is active). If the operation were conducted outside of region 306, (i.e., in region 308), an orbit/tumbling operation would be conducted.

FIGS. 9B-9E illustrate dynamic restroking of the subdivision surface in accordance with one or more embodiments of the invention. As illustrated, the restroking commences at point 902B within region 306 (while a geometry/form 504 is active). Accordingly, the system performs a restroking operation rather than a tumbling operation. The progression through FIGS. 9B-9E illustrate how the reshaping of form 504 occurs in real-time dynamically as the gesture 904B is input by the user. Again, similar to the initial creation of the form 504, the surface is re-interpolating the curves (created from the gesture 904B) based on the base mesh corresponding to such curves. Such interpolation and display of the modified form 504 is performed in real-time dynamically. In this regard, the user is not required to select a particular curve, profile or otherwise before the geometric form 504 is modified.

Figure 9F:
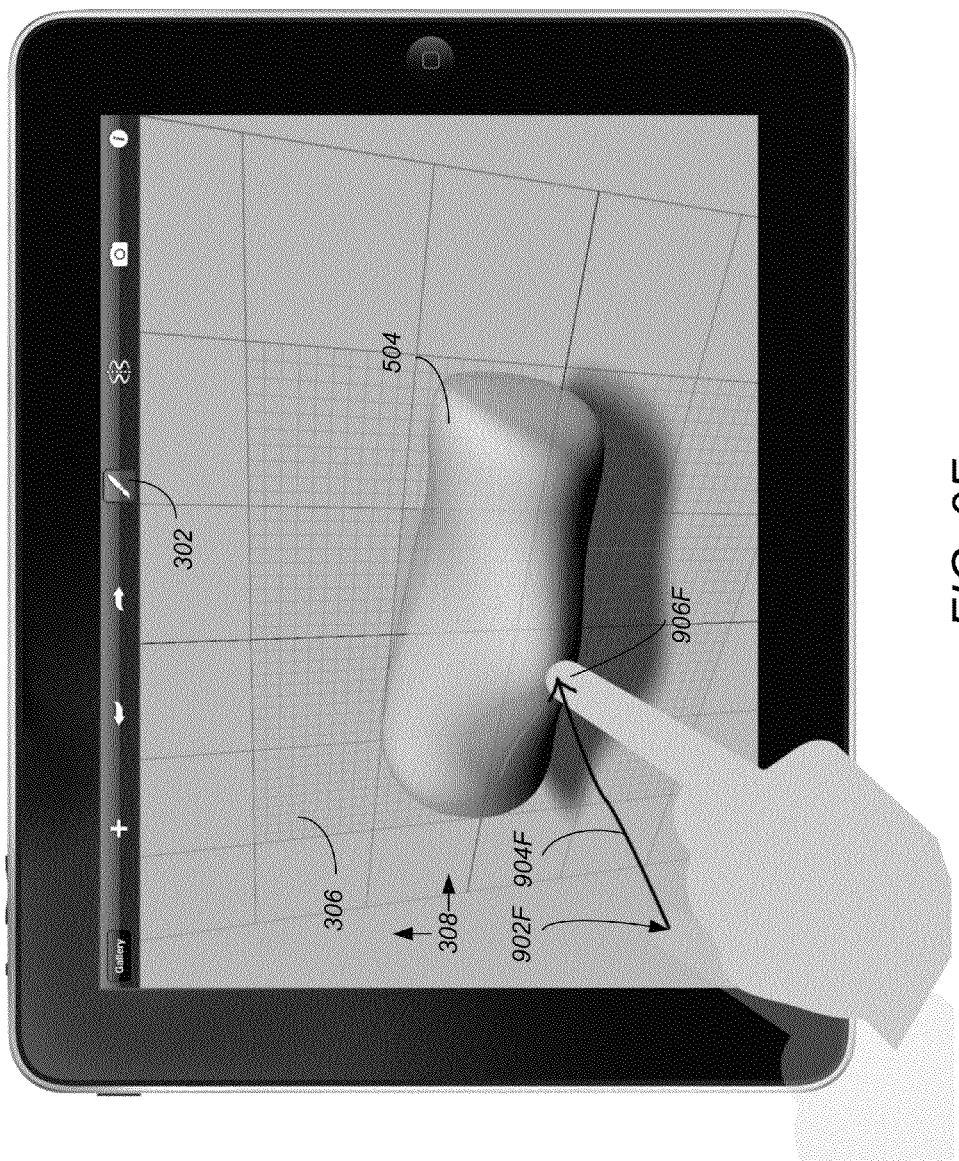
FIG. 9F illustrates a users continued interaction with the modeling tool and the model of FIG. 9A in accordance with one or more embodiments of the invention.

In FIG. 9F, the user continues interacting with the modeling tool 302 and the model of FIG. 9A. The image shows the final state of the grid system 300 while the modeling tool is active 302. The captured gesture 904F occurs/commences at point 902F outside of the grid system 300 (i.e., in region 308) thus invoking a tumble/orbit. The resulting viewing angle (based on the gesture 904F that stops at point 906F) determines that the YZ plane is dominant and all re-stroking operation will be projected to the YZ plane.

Re-Stroking in Different Plane Interactions

FIG. 9G illustrates an example of a user continuing to interact using a modeling tool 302 with the model form of FIG. 9F in a different plane. The user starts re-stroking from a position 902G inside the first outer grid 306. As the user drags a finger along any path 904G, the system dynamically re-shapes the 3D form 504. The form re-shaping is interactive, dynamic, and updates the form 504 every time the gesture 904G is sampled.

The re-stroking modifies the 3D form 504 in relationship to the current YZ grid. Once the user has finished the re-stroking gesture at point 906G describing the path 904G, the system finishes the re-shaping of the 3D form 504 and the user can then either tumble/orbit or re-stroke the 3D form 504.

Thus, as described above, since the stroke 904G begins at a point 902G within region 306, a reshaping operation is performed. Further, the operation is performed in the YZ plane due to the rotation/tumbling that was performed as described above with respect to FIG. 9F. In addition, similar to restroking on the same plane (described above), the restroking operation in a different plane is performed dynamically as the gesture is drawn by the user.

Two Finger Modeling

Figure 10:
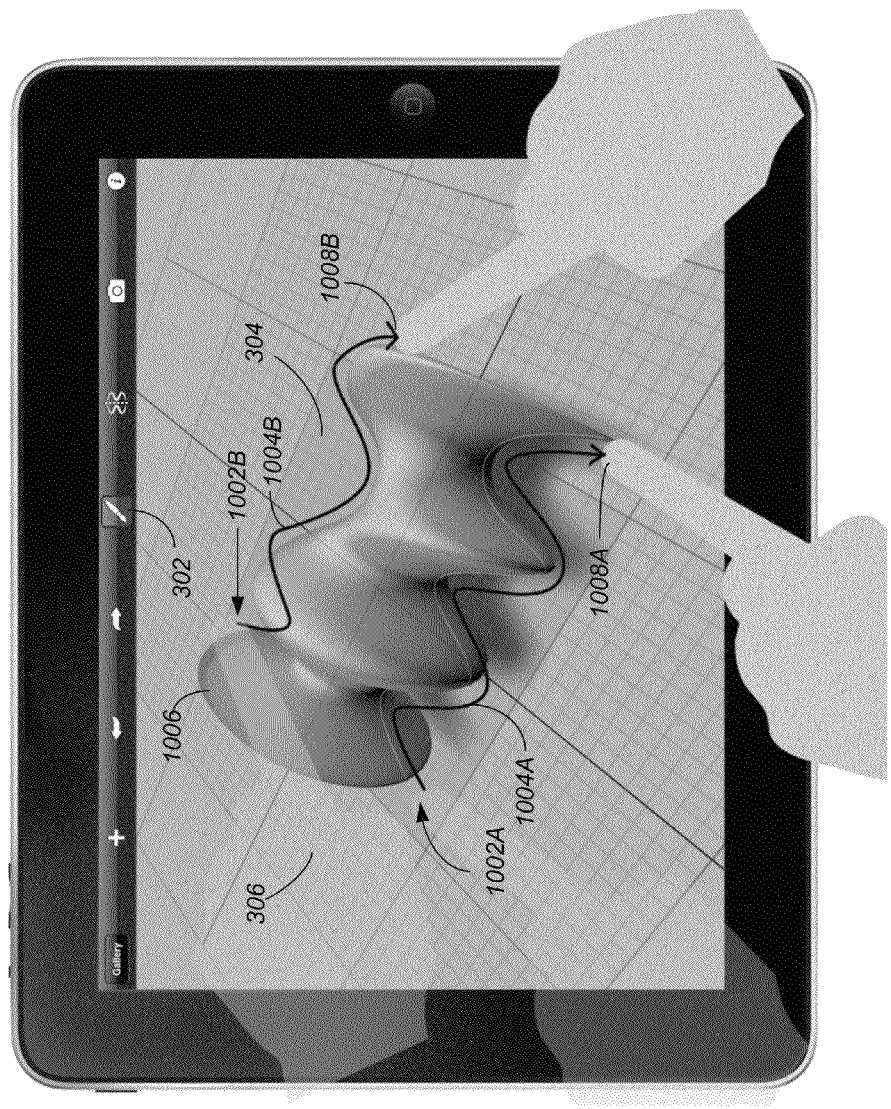
FIG. 10 illustrates an example of a user creating a 3D solid form using two fingers simultaneously in accordance with one or more embodiments of the invention.

FIG. 10 illustrates an example of a user creating a 3D solid form using two fingers simultaneously. The user has activated the modeling tool 302, and in response, the system displays an XY grid determined by the current viewing angle.

The user starts brushing from two positions 1002A and 1002B inside the modeling grid 304. This can be done using two hands or two fingers on the same hand. As the user drags his/her fingers along any paths 1004A and 1004B, the system dynamically creates a 3D form 1006. The form shaping is interactive and updates the form every time it samples the gesture.

Once the user has finished brushing at points 1008A and 1008B, thereby describing the paths 1004A and 1004B, the system finishes shaping the 3D form 1006. The user can then either tumble/orbit or re-stroke the 3D form 1006.

Heuristics may also be in place to differentiate these creation-driven dual touch events from other similar multi-touch gestures like pinching. Pinching may be used in the prior art for zooming and panning.

Logical Flow

Figure 11:
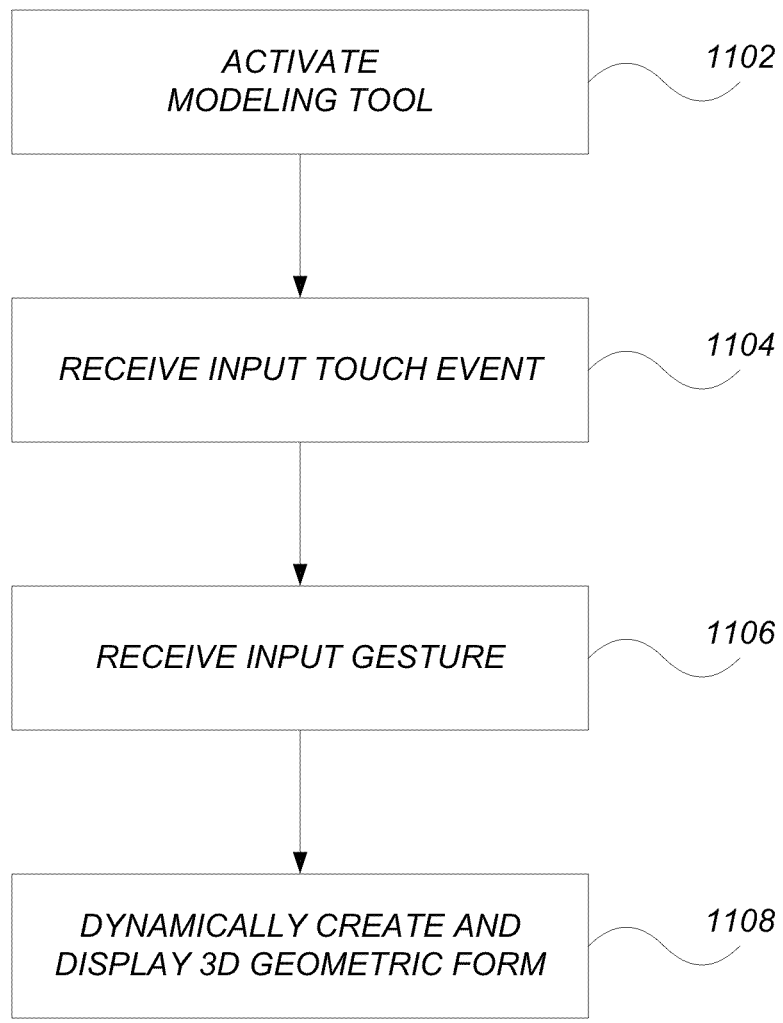
FIG. 11 is a flow chart illustrating the logical flow for dynamically performing three-dimensional (3D) modeling in accordance with one or more embodiments of the invention.

FIG. 11 is a flow chart illustrating the logical flow for dynamically performing three-dimensional (3D) modeling in accordance with one or more embodiments of the invention.

At step 1102, a modeling tool is activated in a 3D modeling application that is executing on a multi-touch device.

At step 1104, an input touch event for creating a new 3D geometric form is received (e.g., a starting touch event is received in a particular region of a grid for creating geometry).

At step 1106, an input gesture is received on the multi-touch device (i.e., that starts that the input touch event).

At step 1108, dynamically, in real-time as the input gesture is received, the new 3D geometric form is created and displayed (e.g., by updating the form every time the input gesture is sampled). The shape of the new 3D geometric form corresponds to the input gesture (e.g., may be based on a direction of the input gesture and an active modeling plane). To create the form, various steps may be performed dynamically in real-time. Such steps include creating a pair of input curves (based on the input gesture), building a base mesh guided by the pair of input curves, and determining a limit surface of the base mesh (where the limit surface is an interpolation of the pair of input curves and is the new 3D geometric form). In this regard, the limit surface may be determined based on interpolating one or more endpoints of the pair of curves with a Catmull-Clark subdivision surface.

The input curves may be uniform cubic b-splines that have a same number of spans. Further, CV hulls of the curves may be used to guide the building of the base mesh. In addition, the building of the base mesh may include (1) building a section of a polygonal complex that interpolates CVs of the pair of curves (where the polygonal complex is for a hexagonal profile), and (2) building a regular hexagon based on the hexagonal profile (where the regular hexagon constitutes the base mesh).

Step 1108 may also include the ability to restroke or orbit the completed form. In this regard, upon finishing the input gesture, the shaping of the new 3D geometric form may also be finished/completed. Subsequent thereto, a second input gesture may be received. If the second input gesture is for orbiting the form, in response to the second gesture, the form and viewing angle (displayed on the multi-touch device) are orbited dynamically in real time as the gesture is received. Alternatively, if the second input gesture is for restroking the form, the form is re-shaped by conforming the new 3D form to the second input gesture dynamically in real-time.

The input gesture received at step 1106 may also be two touch events occurring at two (different) positions on the multi-touch device (e.g., for a two finger modeling operation). Heuristics are used to differentiate the two touch events to be used to create the new 3D geometric form from other multi-touch gestures intended to be used for other operations (e.g., a pinch operation for zooming in/out). The shape of the new 3D geometric form conforms to the two input gestures.

CONCLUSION

This concludes the description of the preferred embodiment of the invention. The following describes some alternative embodiments for accomplishing the present invention. For example, any type of computer, such as a multi-touch device, mainframe, minicomputer, personal computer, or computer configuration, such as a timesharing mainframe, local area network, or standalone personal computer could be used with the present invention.

In summary, embodiments of the invention provide a single tool that is displayed with different regions. The single tool provides the ability for the user to perform a variety of operations simply by beginning a touch event (or cursor click event) within a particular region. The tool may be used to navigate/tumble a 3D model, create a 3D geometric form (e.g., on a blank canvas or otherwise), and/or edit an existing 3D geometric form. The operation selected/performed is based on where the touch event begins and not where the gesture associated with the touch event progresses. Nonetheless, once an operation is selected, the operation is based on the user's gesture.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] A. M. Abbas. A Subdivision Surface Interpolating Arbitrarily-Intersecting Network of Curves under Minimal Constraints. cgi2010.miralab.unige.ch, 0:0-3.

[2] H. Biermann, I. M. Martin, D. Zorin, and F. Bernardini. Sharp features on multiresolution subdivision surfaces. Proceedings Ninth Pacific Conference on Computer Graphics and Applications. Pacific Graphics 2001, pages 140-149.

[3] Adi Levin. Interpolating Nets of Curves by Smooth Subdivision Surfaces. Proceedings of SIGGRAPH 99, Computer Graphics Proceedings, Annual Conference Series, pages 57-64, 1999.

[4] a. Nasri. Interpolation of Open Curves by Recursive Subdivision Surfaces. Mathematics of Surfaces VII, pages 173-188, 1997.

[5] a. Nasri, W. Bou Karam, and F. Samavati. Sketch-based subdivision models. In Proceedings of the 6th Eurographics Symposium on Sketch-Based Interfaces and Modeling—SBIM '09, volume 1, page 53, New York, N.Y., USA, 2009. ACM Press.

[6] A. H. Nasri. Constructing polygonal complexes with shape handles for curve interpolation by subdivision surfaces. 1. Computer-Aided Design, 33(11):753-765, September 2001.

[7] Ahmad H. Nasri and Malcolm A. Sabin, Taxonomy of Interpolation Constraints on Recursive Subdivision Curves, The Visual Computer, Volume: 18, Issue: 5-6, Pages: 382-403; 14 May 2002.

[8] S Schaefer, J Warren, and D Zorin. Lofting curve networks using subdivision surfaces. SGP 04 Proc of the 2004 EurographicsACM SIGGRAPH symposium on Geometry processing, pages 103-114, 2004.

What is claimed is:

1. A computer-implemented method performed by a computer for performing three-dimensional (3D) modeling comprising:
    (a) activating, in a 3D modeling application executing on a multi-touch device, a modeling tool;
    (b) receiving an input touch event;
    (c) determining that the input touch event triggers creation of a new 3D geometric form instead of another operation;
    (d) receiving an input gesture on the multi-touch device, wherein the input gesture comprises a drag of a user's finger along a path; and
    (e) dynamically, in real-time as the input gesture is received, creating and displaying the new 3D geometric form, wherein a shape of the new 3D geometric form corresponds to the input gesture.

2. The method of claim 1, wherein:
    the new 3D geometric shape is based on a direction of the input gesture and an active modeling plane.

3. The method of claim 1, wherein the creating the new 3D geometric form comprises the following steps performed dynamically in real-time:
    creating a pair of input curves based on the input gesture;
    building a base mesh guided by the pair of input curves; and
    determining a limit surface of the base mesh, wherein the limit surface comprises an interpolation of the pair of input curves, and wherein the limit surface comprises the new 3D geometric form.

4. The method of claim 3, wherein:
    the pair of input curves comprise uniform cubic b-splines that have a same number of spans; and
    control vertex (CV) hulls of the pair of curves are used to guide the building of the base mesh.

5. The method of claim 4, wherein the building of the base mesh comprises:
    building a section of a polygonal complex that interpolates CVs of the pair of curves, wherein the polygonal complex is for a hexagonal profile; and
    building a regular hexagon based on the hexagonal profile, wherein the regular hexagon comprises the base mesh.

6. The method of claim 3, wherein:
    the limit surface is determined based on interpolating one or more endpoints of the pair of curves with a Catmull-Clark subdivision surface.

7. The method of claim 1, wherein:
    the creating and displaying steps are performed dynamically by updating the new 3D geometric form every time the input gesture is sampled.

8. The method of claim 1, further comprising:
    upon finishing the input gesture, finishing shaping the new 3D geometric form;
    subsequent to finishing shaping, receiving a second input gesture for orbiting the new 3D geometric form; and
    in response to receiving the second input gesture and dynamically in real time as the second input gesture is received, orbiting the new 3D geometric form and viewing angle that is displayed on the multi-touch device.

9. The method of claim 1, further comprising:
    upon finishing the input gesture, finishing shaping the new 3D geometric form;
    subsequent to finishing shaping, receiving a second input gesture for restroking the new 3D geometric form; and
    in response to receiving the second input gesture and dynamically in real time as the second input gesture is received, re-shaping the new 3D geometric form by conforming the new 3D geometric form to the second input gesture.

10. The method of claim 1, wherein:
    the input touch event comprises two touch events occurring at two positions on the multi-touch device;
    the input gesture comprises two input gestures beginning at the two positions;
    heuristics differentiate the two touch events for creating the new 3D geometric form from other multi-touch gestures; and
    the shape of the new 3D geometric form conforms to the two input gestures.

11. An apparatus for performing three-dimensional (3D) modeling in a multi-touch computer system comprising:
    (a) a multi-touch computer device; and
    (b) a 3D modeling application executing on the multi-touch computer device, wherein the 3D modeling application is configured to:

(i) activate a modeling tool;
(ii) receive an input touch event;
(iii) determine that the input touch event triggers creation of a new 3D geometric form instead of another operation;
(iv) receive an input gesture on the multi-touch device, wherein the input gesture comprises a drag of a user's finger along a path; and
(v) dynamically, in real-time as the input gesture is received, create and display the new 3D geometric form, wherein a shape of the new 3D geometric form corresponds to the input gesture.

12. The apparatus of claim 11, wherein:
the new 3D geometric shape is based on a direction of the input gesture and an active modeling plane.

13. The apparatus of claim 11, wherein the 3D modeling application is configured to create the new 3D geometric form by performing the following steps dynamically in real-time:
creating a pair of input curves based on the input gesture;
building a base mesh guided by the pair of input curves; and
determining a limit surface of the base mesh, wherein the limit surface comprises an interpolation of the pair of input curves, and wherein the limit surface comprises the new 3D geometric form.

14. The apparatus of claim 13, wherein:
the pair of input curves comprise uniform cubic b-splines that have a same number of spans; and
control vertex (CV) hulls of the pair of curves are used to guide the building of the base mesh.

15. The apparatus of claim 14, wherein the 3D modeling application is configured to build the base mesh by:
building a section of a polygonal complex that interpolates CVs of the pair of curves, wherein the polygonal complex is for a hexagonal profile; and
building a regular hexagon based on the hexagonal profile, wherein the regular hexagon comprises the base mesh.

16. The apparatus of claim 13, wherein:
the limit surface is determined based on interpolating one or more endpoints of the pair of curves with a Catmull-Clark subdivision surface.

17. The apparatus of claim 11, wherein:
3D modeling application is configured to perform the creating and displaying dynamically by updating the new 3D geometric form every time the input gesture is sampled.

18. The apparatus of claim 11, wherein the 3D modeling application is further configured to:
upon finishing the input gesture, finish shaping the new 3D geometric form;
subsequent to finishing shaping, receive a second input gesture for orbiting the new 3D geometric form; and
in response to receiving the second input gesture, and dynamically in real time as the second input gesture is received, orbit the new 3D geometric form and viewing angle that is displayed on the multi-touch device.

19. The apparatus of claim 11, wherein the 3D modeling application is further configured to:
upon finishing the input gesture, finish shaping the new 3D geometric form;
subsequent to finishing shaping, receive a second input gesture for restroking the new 3D geometric form; and
in response to receiving the second input gesture, and dynamically in real time as the second input gesture is received, re-shape the new 3D geometric form by conforming the new 3D geometric form to the second input gesture.

20. The apparatus of claim 11, wherein:
the input touch event comprises two touch events occurring at two positions on the multi-touch device;
the input gesture comprises two input gestures beginning at the two positions;
heuristics differentiate the two touch events for creating the new 3D geometric form from other multi-touch gestures; and
the shape of the new 3D geometric form conforms to the two input gestures.

* * * * *